(12) United States Patent
Feng et al.

(10) Patent No.: US 11,620,934 B2
(45) Date of Patent: Apr. 4, 2023

(54) SHIFT REGISTER FOR OUTPUTTING HYBRID PULSES FOR DISPLAY AND COMPENSATION AND DRIVING METHOD THEREFOR, GATE DRIVING CIRCUIT, AND DISPLAY PANEL

(71) Applicants: Hefei BOE Joint Technology Co., Ltd., Anhui (CN); BOE Technology Group Co., Ltd., Beijing (CN)

(72) Inventors: Xuehuan Feng, Beijing (CN); Yongqian Li, Beijing (CN)

(73) Assignees: Hefei BOE Joint Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/424,486

(22) PCT Filed: Aug. 25, 2020

(86) PCT No.: PCT/CN2020/111042
§ 371 (c)(1),
(2) Date: Jul. 20, 2021

(87) PCT Pub. No.: WO2021/037021
PCT Pub. Date: Mar. 4, 2021

(65) Prior Publication Data
US 2022/0180795 A1    Jun. 9, 2022

(30) Foreign Application Priority Data
Aug. 30, 2019   (CN) .......................... 201910816758.5

(51) Int. Cl.
*G09G 3/20* (2006.01)
*G11C 19/28* (2006.01)

(52) U.S. Cl.
CPC .......... *G09G 3/2092* (2013.01); *G11C 19/28* (2013.01); *G09G 2310/0286* (2013.01); *G09G 2310/061* (2013.01); *G09G 2310/08* (2013.01)

(58) Field of Classification Search
CPC ......... G09G 3/2092; G09G 2310/0286; G09G 2310/061; G09G 2310/08; G11C 19/28
See application file for complete search history.

(56) References Cited

U.S. PATENT DOCUMENTS

2017/0162122 A1   6/2017  In
2018/0033391 A1   2/2018  So et al.
(Continued)

FOREIGN PATENT DOCUMENTS

| CN | 108648716 A | 10/2018 |
| CN | 108766340 A | 11/2018 |

(Continued)

OTHER PUBLICATIONS

CN201910816758.5 first office action.

*Primary Examiner* — Ram A Mistry
(74) *Attorney, Agent, or Firm* — IPro, PLLC

(57) ABSTRACT

The invention provides a shift register, a drive method thereof, a gate drive circuit, and a display panel. Wherein, the shift register comprises: a display control circuit connected to a pull-up node, a first power terminal and a first control terminal; a sensing control circuit connected to the pull-up node, a second control terminal and a third control terminal and configured to store a potential of the pull-up node in a display mode under the control of the second control terminal and write the stored potential into the pull-up node in a sensing mode under the control of the third control terminal; and a first output circuit connected to the pull-up node, a first clock terminal and a first output terminal.

18 Claims, 7 Drawing Sheets

(56) References Cited

U.S. PATENT DOCUMENTS

| | | |
|---|---|---|
| 2018/0337682 A1 | 11/2018 | Takasugi et al. |
| 2020/0042153 A1* | 2/2020 | Yang |
| 2020/0243018 A1* | 7/2020 | Kim .................... G09G 3/3677 |
| 2021/0065630 A1 | 3/2021 | Feng et al. |
| 2021/0142713 A1 | 5/2021 | Feng et al. |
| 2021/0201810 A1 | 7/2021 | Feng et al. |
| 2021/0358365 A1 | 11/2021 | Feng et al. |
| 2021/0358366 A1 | 11/2021 | Feng et al. |

FOREIGN PATENT DOCUMENTS

| | | |
|---|---|---|
| CN | 109935200 A | 6/2019 |
| CN | 109935212 A | 6/2019 |
| CN | 109935269 A | 6/2019 |
| CN | 109949749 A | 6/2019 |
| CN | 110136653 A | 8/2019 |
| KR | 20160073928 A | 6/2016 |
| KR | 20160078781 A | 7/2016 |
| KR | 20180014277 A | 2/2018 |

* cited by examiner

S1 — In a display mode, write, by a display control circuit under the control of a first control terminal, a potential provided by a first power terminal into a pull-up node, store, by a sensing control circuit under the control of a second control terminal, the potential of the pull-up node, and supply, by a first output circuit under the control of the potential of the pull-up node, a first clock signal of a first clock terminal to a first output terminal to be used as a gate drive signal S2 — In a sensing mode, write, by the sensing control circuit under the control of a third control terminal, the stored potential into the pull-up node, and supply, by the first output circuit under the control of the potential of the pull-up node, the first clock signal of the first clock terminal to the first output terminal to be used as a sensing drive signal

Fig. 7

SHIFT REGISTER FOR OUTPUTTING HYBRID PULSES FOR DISPLAY AND COMPENSATION AND DRIVING METHOD THEREFOR, GATE DRIVING CIRCUIT, AND DISPLAY PANEL

The application claims priority to Chinese Patent Application No. 201910816758.5, filed with the China National Intellectual Property Administration on Aug. 30, 2019, which is incorporated herein by reference in its entirety.

TECHNICAL FIELD

The invention relates to the technical field of display, in particular to a shift register, a drive method thereof, a gate drive circuit, and a display panel.

BACKGROUND

In the technical field of display, gate drive circuits are generally used to replace gate drive chips to reduce costs. However, it is very hard for OLED (organic light-emitting diode) gate drive circuits in the related art to realize waveforms with different cycles and pulse widths for display and compensation, output waveforms are complicated, and a circuit structure required is also very complicated.

SUMMARY

The embodiments of the disclosure provide a shift register, comprising:

a display control circuit connected to a pull-up node, a first power terminal and a first control terminal, and configured to write a potential, provided by the first power terminal, into the pull-up node in a display mode under the control of the first control terminal;

a sensing control circuit connected to the pull-up node, a second control terminal and a third control terminal, and configured to store the potential of the pull-up node in the display mode under the control of the second control terminal and write the stored potential into the pull-up node in a sensing mode under the control of the third control terminal; and a first output circuit connected to the pull-up node, a first clock terminal and a first output terminal, and configured to supply a first clock signal of the first clock terminal to the first output terminal under the control of the potential of the pull-up node.

For example, the sensing control circuit comprises:

a sensing input sub-circuit connected to the pull-up node, a hold node, and the second control terminal, and configured to store the potential of the pull-up node in the hold node under the control of the second control terminal; and a sensing pull-up sub-circuit connected to the pull-up node, the hold node and the third control terminal, and configured to write the potential, stored in the hold node, into the pull-up node in the sensing mode under the control of the third control terminal.

For example, the sensing input sub-circuit comprises:

a first transistor having a first pole connected to the pull-up node, a second pole connected to the hold node, and a control pole connected to the second control terminal; and a first capacitor having a terminal connected to the hold node and a terminal connected to a second power terminal.

For example, the sensing pull-up sub-circuit comprises:

a second transistor having a first pole connected to the hold node, a second pole connected to the pull-up node, and a control pole connected to the third control terminal.

For example, the first output circuit comprises:

a third transistor having a first pole connected to the first clock terminal, a second pole connected to the first output terminal, and a control pole connected to the pull-up node; and a second capacitor having a terminal connected to the control pole of the third transistor and a terminal connected to the second pole of the third transistor.

For example, the shift register further comprises:

a cascade output circuit connected to a second clock terminal, the pull-up node and a cascade output terminal, and configured to supply a second clock signal of the second clock terminal to the cascade output terminal under the control of the potential of the pull-up node.

For example, the cascade output circuit comprises:

a fourth transistor having a first pole connected to the second clock terminal, a second pole connected to the cascade output terminal, and a control pole connected to the pull-up node.

For example, the display control circuit comprises:

an input sub-circuit connected to the pull-up node, the first power terminal and the first control terminal, and configured to write the potential, provided by the first power terminal, into the pull-up node in the display mode under the control of the first control terminal;

a discharge sub-circuit connected to the pull-up node, a second power terminal and a discharge control terminal, and configured to discharge the pull-up node to a potential of the second power terminal according to a discharge control signal of the discharge control terminal;

a pull-down control sub-circuit connected to the pull-up node, a pull-down node, the first power terminal and the second power terminal, and configured to control a potential of the pull-down node by means of the potential of the first power terminal and the potential of the second power terminal under the control of the pull-up node;

a first pull-down sub-circuit connected to the pull-down node, the pull-up node, the cascade output terminal and the second power terminal, and configured to pull the pull-up node and the cascade output terminal down to the potential of the second power terminal under the control of the pull-down node;

a second pull-down sub-circuit connected to the pull-down node, the first output terminal and a third power terminal, and configured to pull the first output terminal down to a potential of the third power terminal under the control of the pull-down node; and a reset sub-circuit connected to a reset control terminal, the pull-up node and the second power terminal, and configured to reset the pull-up node to the potential of the second power terminal under the control of the reset control terminal.

For example, the input sub-circuit comprises: a fifth transistor having a first pole connected to the first power terminal, a second pole connected to the pull-up node, and a control pole connected to the first control terminal.

For example, the discharge sub-circuit comprises: a sixth transistor having a first pole connected to the pull-up node, a second pole connected to the second power terminal, and a control pole connected to the discharge control terminal.

For example, the pull-down control sub-circuit comprises: a seventh transistor and an eighth transistor, wherein a control pole and a first pole of the seventh transistor are both connected to the first power terminal, a second pole of the seventh transistor and a first pole of the eighth transistor are connected to the pull-down node, a control pole of the eighth transistor is connected to the pull-up node, and a second pole of the eighth transistor is connected to the second power terminal.

For example, the first pull-down sub-circuit comprises: a ninth transistor and a tenth transistor, wherein a first pole of the ninth transistor is connected to the pull-up node, a second pole of the ninth transistor is connected to the second power terminal, a control pole of the ninth transistor is connected to the pull-down node, a first pole of the tenth transistor is connected to the cascade output terminal, a second pole of the tenth transistor is connected to the second power terminal, and a control pole of the tenth transistor is connected to the pull-down node.

For example, the second pull-down sub-circuit comprises: an eleventh transistor having a first pole connected to the first output terminal, a second pole connected to the third power terminal, and a control pole connected to the pull-down node.

For example, the reset sub-circuit comprises: a twelfth transistor having a first pole connected to the pull-up node, a second pole connected to the second power terminal, and a control pole connected to the reset control terminal.

The embodiments of the disclosure provide a gate drive circuit, the gate drive circuit comprises N levels of cascaded shift registers according to the above, wherein N is an integer greater than 1.

For example, the first control terminal of an $n^{th}$ level of shift register is connected to a cascade output terminal of a $(n-2)^{th}$ level of shift register, and a discharge control terminal of the $n^{th}$ level of shift register is connected to a cascade output terminal of a $(n+3)^{th}$ level of shift register, wherein n is an integer, and $3 \leq n \leq N-3$.

The embodiments of the disclosure provide a display panel, wherein the display panel comprises the above gate drive circuit.

The embodiments of the disclosure provide a drive method of the above shift register, the method comprises:

in the display mode, writing, by the display control circuit under the control of the first control terminal, the potential provided by the first power terminal into the pull-up node, storing, by the sensing control circuit under the control of the second control terminal, the potential of the pull-up node, and supplying, by the first output circuit under the control of the potential of the pull-up node, the first clock signal of the first clock terminal to the first output terminal; and in the sensing mode, writing, by the sensing control circuit under the control of the third control terminal, the stored potential into the pull-up node, and supplying, by the first output circuit under the control of the potential of the pull-up node, the first clock signal of the first clock terminal to the first output terminal.

Other aspects and advantages of the invention will be given in the following description, and part of these aspects and advantages will become obvious from the following description or be known in the practice of the invention.

BRIEF DESCRIPTION OF THE DRAWINGS

The embodiments of the invention will be described below in conjunction with the accompanying drawings to make the above and/or other aspects and advantages of the invention obvious and easily understood, wherein:

FIG. 7 is a flow diagram of a drive method of a shift register according to the embodiments of the invention.

DETAILED DESCRIPTION

The embodiments of the invention will be described in detail below, and examples of the embodiments are illustrated by the accompanying drawings, in which identical or similar reference signs represent identical or similar elements, or elements with identical or similar functions throughout the specification. The embodiments described below with reference to the accompanying drawings are merely illustrative ones for explaining the invention, and should not be construed as limitations of the invention.

The embodiments of the invention provide a shift register, a drive method thereof, a gate drive circuit, and a display panel, which will be described below with reference to the accompanying drawings.

Figure 1:
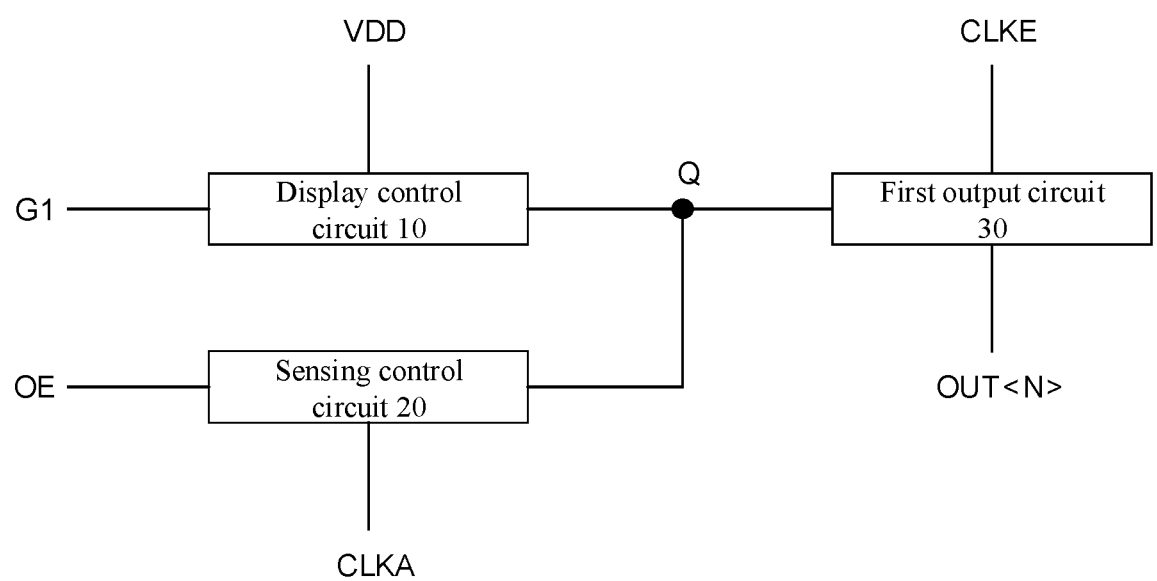
FIG. 1 is a block diagram of a shift register according to the embodiments of the invention.

FIG. 1 is a block diagram of a shift register according to the embodiments of the invention. As shown in FIG. 1, the shift register provided by the embodiments of the invention comprises: a display control circuit 10, a sensing control circuit 20, and a first output circuit 30.

As shown in FIG. 1, the display control circuit 10 is connected to a pull-up node Q, a first power terminal VDD and a first control terminal G1. The display control circuit 10 is able to write a potential, provided by the first power terminal VDD, into the pull-up node Q in a display mode under the control of the first control terminal G1. The sensing control circuit 20 is connected to the pull-up node Q, a second control terminal OE and a third control terminal CLKE. The sensing control circuit 20 is able to store the potential of the pull-up node Q in the display mode under the control of the second control terminal OE. For example, the sensing control circuit 20 is able to hold the potential of the node according to a second control signal of the second control terminal OE when the display control circuit 10 writes the potential, provided by the first power terminal VDD, into the pull-up node Q. The sensing control circuit 20 is able to write, for example a potential stored in a hold node, into the pull-up node Q in a sensing mode under the control of the third control terminal CLKA. The first output circuit 30 is connected to the pull-up node Q, a first clock terminal CLKE and a first output terminal OUT<N>. The first output circuit 30 is able to supply a first clock signal of the first clock terminal CLKE to the first output terminal OUT<N> under the control of the potential of the pull-up node Q. For example, the first output circuit 30 is able to control the first output terminal OUT<N> to output a gate drive signal in the display mode according to the potential of the pull-up node Q and the first clock signal of the first clock terminal CLKE, and is able to control the first output terminal OUT<N> to output a sensing drive signal in the sensing mode according to the potential of the pull-up node Q and the first clock signal of the first clock terminal CLKE.

It should be noted that the potential of the first power terminal VDD may be a DC high potential.

Figure 2:
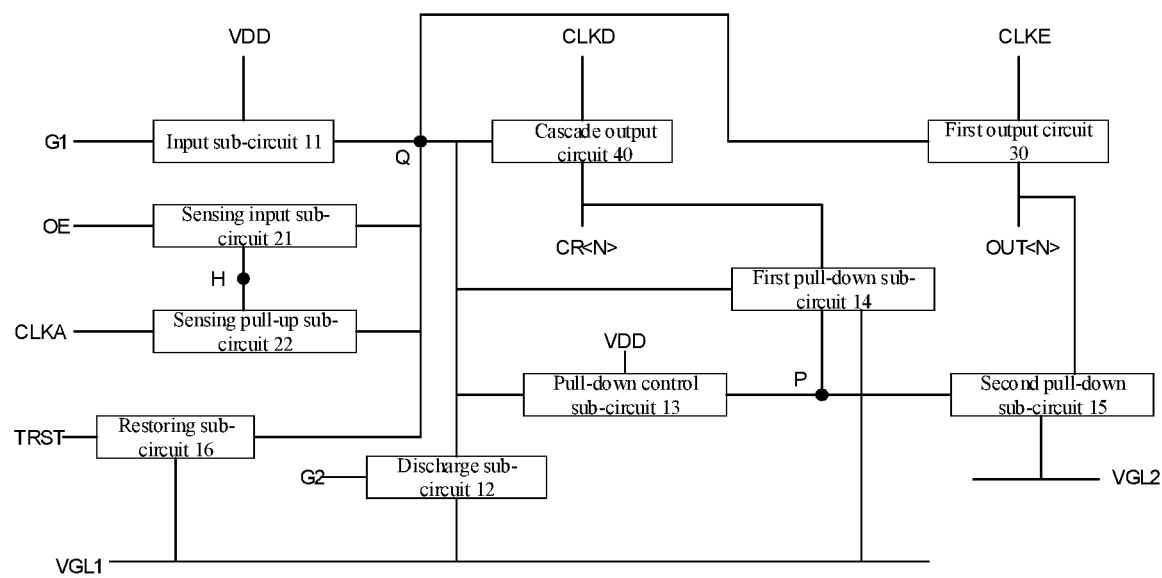
FIG. 2 is a block diagram of the shift register according to one embodiment of the invention.

According to one embodiment of the invention, as shown in FIG. 2, the sensing control circuit 20 comprises: a sensing input sub-circuit 21 and a sensing pull-up sub-circuit 22. The sensing input sub-circuit 21 is connected to the pull-up node Q, the hold node H, and the second control terminal OE. The sensing input sub-circuit 21 is able to store the potential of the pull-up node Q in the display mode under the control of the second control terminal OE. For example, the potential provided by the first power source VDD is written into the hold node H according to the second control signal of the second control terminal 22 when the display control circuit 10 writes the potential, provided by the first power terminal VDD, into the pull-up node Q. The sensing pull-up sub-circuit 22 is connected to the pull-up node Q, the hold node H and a third control terminal CLKA. The sensing pull-up sub-circuit 22 is able to write the potential, stored in the hold node H, into the pull-up node Q in the sensing mode according to a third control signal of the third control terminal CLKA.

Wherein, the second control signal of the second control terminal OE may be a random signal generated by an external circuit such as a Field-Programmable Gate Array (FPGA).

According to one embodiment of the invention, as shown in FIG. 2, the shift register further comprises: a cascade output circuit 40 connected to a second clock terminal CLKD, the pull-up node Q and a cascade output terminal CR<N>. The cascade output circuit 40 is able to supply a second clock signal of the second clock terminal CLKD to the cascade output terminal CR<N>under the control of the potential of the pull-up node Q. For example, the cascade output circuit 40 is able to control the cascade output terminal CR<N> to output a cascade control signal in the display mode according to the potential of the pull-up node Q and the second control signal of the second clock terminal CLKD.

Furthermore, according to one embodiment of the invention, as shown in FIG. 2, the display control circuit 10 comprises: an input sub-circuit 11, a discharge sub-circuit 12, a pull-down control sub-circuit, a first pull-down sub-circuit 14, a second pull-down sub-circuit 15 and a reset sub-circuit 16. The input sub-circuit 11 is connected to the pull-up node Q, the first power terminal VDD and the first control terminal G1, and is used to write the potential, provided by the first power terminal VDD, into the pull-up node Q in the display mode under the control of the first control terminal G1. The discharge sub-circuit 12 is connected to the pull-up node Q, a second power terminal VGL1 and a discharge control terminal G2, and is used to control the discharge of the pull-up node Q according to a discharge control signal of the discharge control terminal G2. For example, the discharge sub-circuit 12 controls the pull-up node Q to discharge to a potential of the second power terminal VGL1. The pull-down control sub-circuit 13 is connected to the pull-up node Q, a pull-down node P, the first power terminal VDD and the second power terminal VGL1, and is used to control a potential of the pull-down node P by means of the potential of the first power terminal VDD and the potential of the second power terminal VGL1 under the control of the pull-up node Q. For example, the pull-down control sub-circuit 13 writes the potential of the first power terminal VDD or the second power terminal VGL1 into the pull-down node P under the control of the pull-up node Q. The first pull-down sub-circuit 14 is connected to the pull-down node P, the pull-up node Q, the cascade output terminal CR<N> and the second power terminal VGL1, and is used to pull the pull-up node Q and the cascade output terminal CR down to the potential of the second power terminal VGL1 under the control of the pull-down node P. The second pull-down sub-circuit 15 is connected to the pull-down node P, the first output terminal OUT<N> and a third power terminal VGL2, and is used to pull the first output terminal OUT<N> to a potential of the third power terminal VGL2 under the control of the pull-down node P. The reset sub-circuit 16 is connected to a reset control terminal TRST, the pull-up node Q and the second power terminal VGL1, and is used to pull the pull-up node Q down to the potential of the second power terminal VGL1 under the control of the reset control terminal TRST.

It should be noted that the potential of the second power terminal VGL1 and the potential of the third power terminal VGL2 are both DC negative potentials, the values of which may be identical or different. Preferably, the potential of the third power terminal VGL2 is higher than the potential of the second power terminal VGL1.

According to one embodiment of the invention, the first control terminal G1 of the shift register is connected to the cascade output terminal CR<N> of a shift register which is two levels previous to the shift register, and the discharge control terminal G2 of the shift register is connected to the cascade output terminal CR<N> of a shift register which is three levels next to the shift register, which will be described in further detail below with reference to FIG. 5.

The structure of the shift register provided by the embodiments of the invention will be described below in conjunction with FIG. 3.

Figure 3:
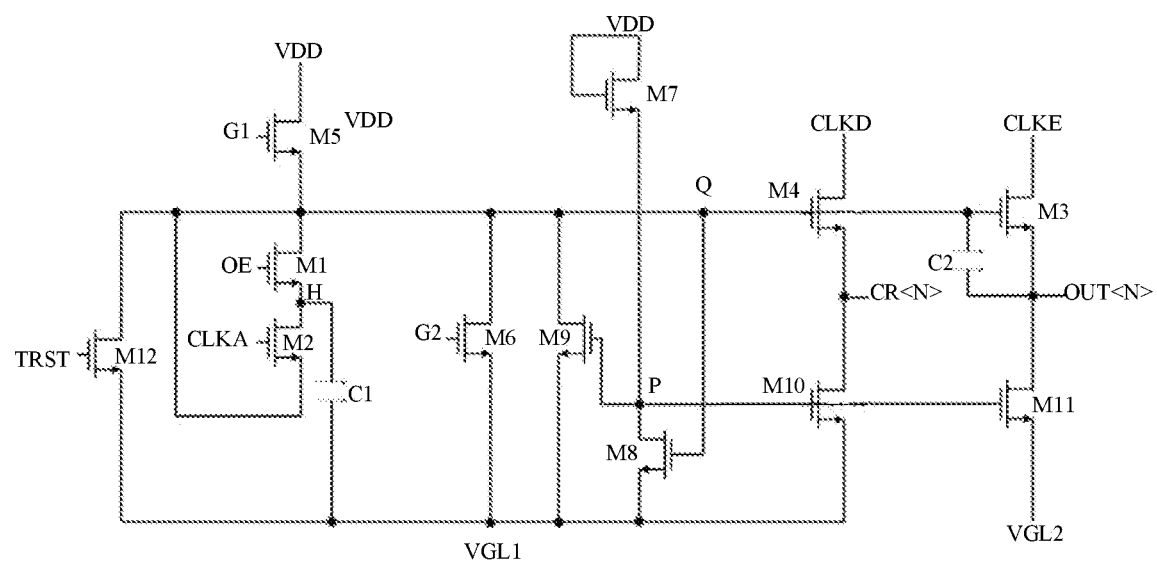
FIG. 3 is a schematic circuit diagram of the shift register according to one embodiment of the invention.

As shown in FIG. 3, the sensing input sub-circuit 21 comprises: a first transistor M1 and a first capacitor C1, wherein a first pole of the first transistor M1 is connected to the pull-up node Q, a second pole of the first transistor M1 is connected to the hold node H, and a control pole of the first transistor M1 is connected to the second control terminal OE; and one terminal of the first capacitor C1 is connected to the hold node H, and the other terminal of the first capacitor C1 is connected to the second power terminal VGL1.

As shown in FIG. 3, the sensing pull-up sub-circuit 22 comprises: a second transistor M2, wherein a first pole of the second transistor M2 is connected to the hold node H, a second pole of the second transistor M2 is connected to the pull-up node Q, and a control pole of the second transistor M2 is connected to the third control terminal CLKA.

As shown in FIG. 3, the first output circuit 30 comprises: a third transistor M3 and a second capacitor C2, wherein a first pole of the third transistor M3 is connected to the first clock terminal CLKE, a second pole of the third transistor M3 is connected to the first output terminal OUT<N>, and a control pole of the third transistor M3 is connected to the pull-up node Q; and one terminal of the second capacitor C2 is connected to the control pole of the third transistor M3, and the other terminal of the second capacitor C2 is connected to the second pole of the third transistor M3.

As shown in FIG. 3, the cascade output circuit 40 comprises: a fourth transistor M4, wherein a first pole of the fourth transistor M4 is connected to the second clock terminal CLKD, a second pole of the fourth transistor M4 is connected to the cascade output terminal CR, and a control pole of the fourth transistor M4 is connected to the pull-up node Q.

As shown in FIG. 3, the input sub-circuit 11 comprises: a fifth transistor M5, wherein a first pole of the fifth transistor M5 is connected to the first power terminal VDD, a second pole of the fifth transistor M5 is connected to the pull-up node Q, and a control pole of the fifth transistor M5 is connected to the first control terminal G1.

As shown in FIG. 3, the discharge sub-circuit 12 comprises: a sixth transistor M6, wherein a first pole of the sixth transistor M6 is connected to the pull-up node Q, a second pole of the sixth transistor M6 is connected to the second power terminal VGL1, and a control pole of the sixth transistor M6 is connected to the discharge control terminal G2.

As shown in FIG. 3, the pull-down control sub-circuit 13 comprises: a seventh transistor M7 and an eighth transistor M8, wherein a control pole and a first pole of the seventh transistor M7 are both connected to the first power terminal VDD, a second pole of the seventh transistor M7 is connected to a first pole of the eighth transistor M8, a control pole of the eighth transistor M8 is connected to the first pull-up node Q, and a second pole of the eighth transistor M8 is connected to the second power terminal VGL1.

As shown in FIG. 3, the first pull-down sub-circuit 14 comprises: a ninth transistor M9 and a tenth transistor M10, wherein a first pole of the ninth transistor M9 is connected to the pull-up node Q, a second pole of the ninth transistor M9 is connected to the second power terminal VGL1, and a control pole of the ninth transistor M9 is connected to the pull-down node P; and a first pole of the tenth transistor M10 is connected to the cascade output terminal CR<N>, a second pole of the tenth transistor M10 is connected to the second power terminal VGL1, and a control pole of the tenth transistor M10 is connected to the pull-down node P.

As shown in FIG. 3, the second pull-down sub-circuit 15 comprises: an eleventh transistor M11, wherein a first pole of the eleventh transistor M11 is connected to the first output terminal OUT<N>, a second pole of the eleventh transistor M11 is connected to the third power terminal VGL2, and a control pole of the eleventh transistor M11 is connected to the pull-down node P.

As shown in FIG. 3, the reset sub-circuit 16 comprises: a twelfth transistor M12, wherein a first pole of the twelfth transistor M12 is connected to the pull-up node Q, a second pole of the twelfth transistor M12 is connected to the second power terminal VGL1, and a control pole of the twelfth transistor M12 is connected to the reset control terminal TRST.

It should be noted that, in the embodiments of the invention, NPN-type MOSFET or IGBT transistors are described by way of example.

It should also be noted that the first capacitor C1 and the second capacitor C2 may be parasitic capacitors of the transistors, or external capacitors.

Based on the shift register in the above embodiment, the embodiments of the invention further provide a gate drive circuit, comprising multiple levels of shift registers mentioned above.

Figure 4:
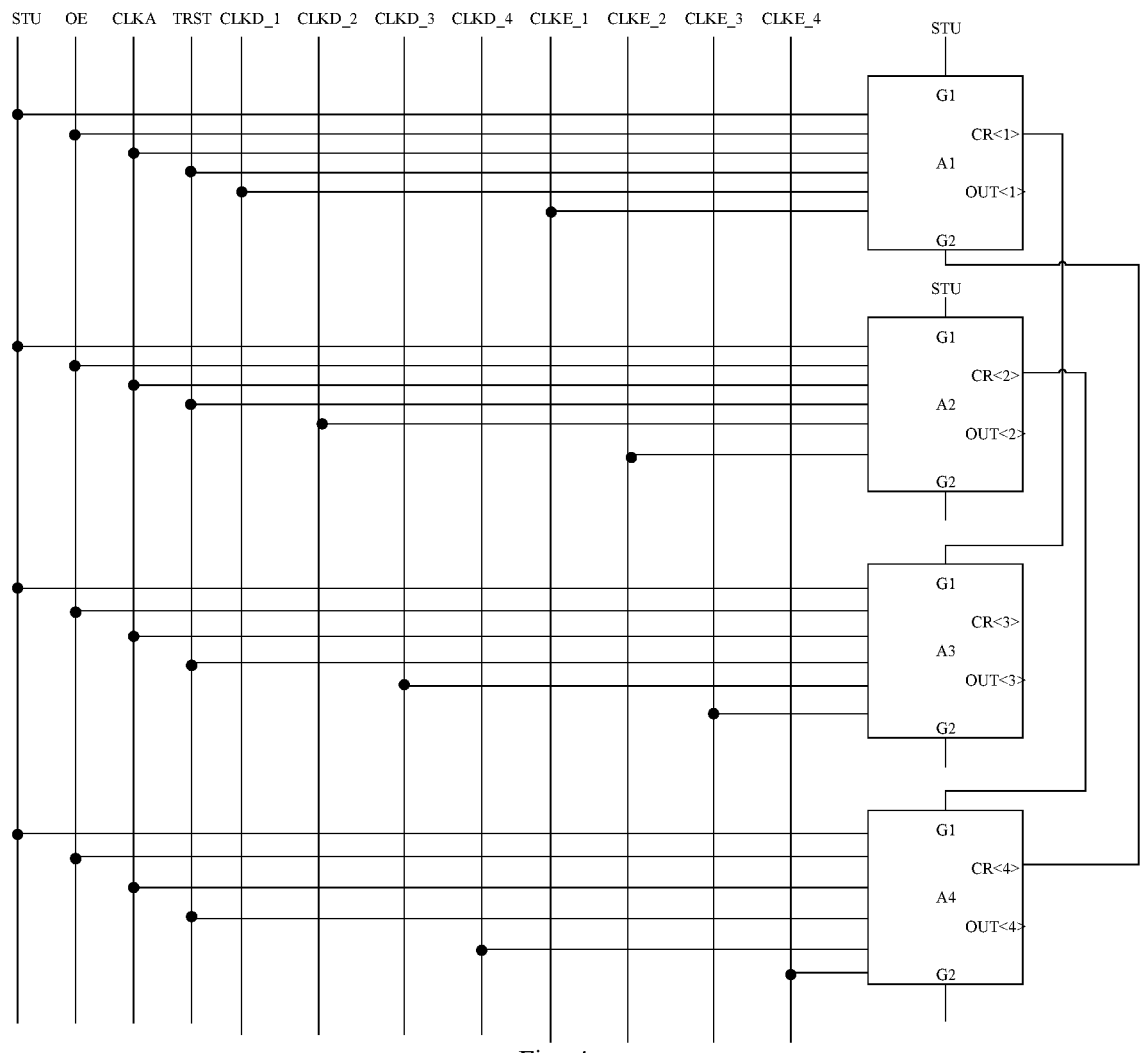
FIG. 4 is a schematic diagram of a gate drive circuit according to one embodiment of the invention.

FIG. 4 is a schematic diagram of a gate drive circuit according to one embodiment of the invention.

As shown in FIG. 4, the gate drive circuit comprises N levels of cascaded shift registers according to any one of claims 1-14, wherein N is an integer greater than 1. In some embodiments, the first control terminal of the $n^{th}$ level of shift register is connected to the cascade output terminal of the $(n-2)^{th}$ level of shift register, and the discharge control terminal of the nth level of shift register is connected to the cascade output terminal of the $(n+3)^{th}$ level of shift register, wherein n is an integer, and $3 \leq n \leq N-3$. For example, as shown in FIG. 4, a preset input signal STU is input to the first control terminals G1 of the first level of shift register A1 and the second level of shift register A2, and the discharge control terminal G2 of the first level of shift register A1 is connected to the cascade output terminal CR<4> of the fourth level of shift register A4; the discharge control terminal G2 of the second level of shift register A2 is connected to the cascade output terminal CR<5> of the fifth level of shift register A5; the first control terminal G1 of the third level of shift register A3 is connected to the cascade output terminal CR<1> of the first level of shift register A1, and the discharge control terminal G2 of the third level of shift register A3 is connected to the cascade output terminal CR<6> of the sixth level of shift register A8; and the first control terminal G1 of the fourth level of shift register A4 is connected to the cascade output terminal CR<2> of the second level shift register A2, and the discharge control terminal G2 of the fourth level of shift register A4 is connected to the cascade output terminal CR<7> of the seventh level of shift register A7, and so on.

In FIG. 4, the gate drive circuit is controlled by eight clock signals CLKD_1, CLKE_1, . . . , CLKD_4 and CLKE_4, wherein the shift registers are divided into multiple groups, and each group includes four levels of cascaded shift registers that are connected to receive the eight clock signals. As shown in FIG. 4, the first clock terminal and the second clock terminal of the first level of shift register A1 are connected to receive the clock signals CLKD_1 and CLKE_1, the first clock terminal and the second clock terminal of the second level of shift register A2 are connected to receive the clock signals CLKD_2 and CLKE_2, the first clock terminal and the second clock terminal of the third level of shift register A3 are connected to receive the clock signals CLKD_3 and CLKE_3, and the first clock terminal and the second clock terminal of the fourth level of shift register A4 are connected to receive the clock signals CLKD_4 and CLKE_4. Similarly, the first clock terminal and the second clock terminal of the fifth level of shift register A5 are connected to receive the clock signals CLKD_1 and CLKE_1, and the first clock terminal and the second clock terminal of the sixth level of shift register A6 are connected to receive the clock signals CLKD_2 and CLKE_2, and so on.

In FIG. 4, the second control terminals OE of the shift registers are connected to receive a second control signal (OE in FIG. 4), the third control terminals CLKA are connected to receive a third control signal (CLKA in FIG. 4), and the reset control terminals TRST are connected to receive a reset control signal (TRST in FIG. 4).

According to the gate drive circuit provided by the embodiments of the invention, hybrid pulses for display and compensation can be output by multiple levels of shift registers, any row of pixels may be compensated in the display mode of any frame, and the circuit structure is simple.

With reference to the sequence diagram shown by FIG. 5, the operating principle of the embodiment illustrated by FIG. 4 is as follows. With the fourth level of shift register A4 in the embodiment illustrated by FIG. 4 as an example, the signal sequence of the shift register in the embodiment of the disclosure will be described below.

Figure 5:
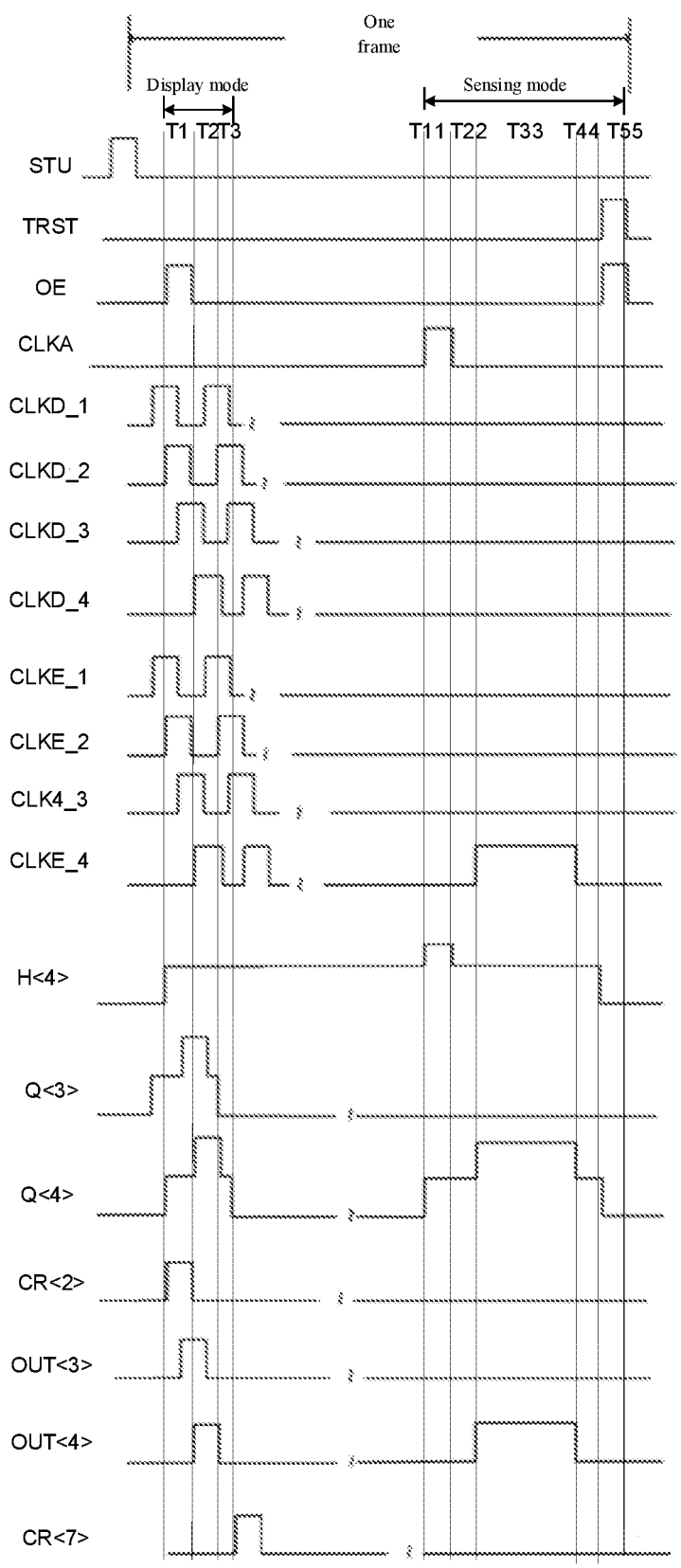
FIG. 5 is a signal sequence diagram of the gate drive circuit according to one embodiment of the invention.

As shown in FIG. 5, H<4> is a potential signal of the hold node H of the fourth level of shift register, Q<3> is a potential signal of the pull-up node Q of the third level of shift register, Q<4> is a potential signal of the pull-up node of the fourth level of shift register, OUT<3> is an output signal of the first output terminal of the third level of shift register, OUT<4> is an output signal of the first output terminal of the fourth level of shift register, CR<2> is an output signal of the cascade output terminal of the second level of shift register, and CR<7> is an output signal of the cascade output terminal of the seventh level of shift register. Wherein, the pulse width relation of the third control signal of the third control terminal CLKA, the second clock signal of the second clock terminal CLKD, the first clock signal of the first clock terminal CLKE and the output signal of the reset control terminal TRST is adjustable.

In a first stage T1 of the display mode, the output signal CR<2> of the cascade output terminal of the second level of shift register is a high level signal, such that the first control terminal G1 of the fourth level of shift register outputs a high level signal. Referring to FIG. 4, in the fourth level of shift register, the high level signal output by the first control terminal G1 enables the fifth transistor M5 to be turned on, a high potential provided by the first power terminal VDD is written into the pull-up node Q<4> by means of the fifth transistor M5, the second capacitor C2 is charged, and the third transistor M3 and the fourth transistor M4 are pre-started. The second control signal output by the second control terminal OE is a high level signal, such that the first transistor M1 is turned on, the high potential provided by the first power terminal VDD is written into the hold node H<4> by means of the fifth transistor M5 and the first transistor M1 and is held by the first capacitor C1. At this moment, the third control signal output by the third control terminal CLKA is a low level signal, and the second transistor M2 is turned off. The clock signal CLKE_4 is a low level, such that the first clock signal output by the first clock terminal CLKE of the fourth level of shift register is a low potential signal, and the cascade output terminal CR<4> of the fourth level of shift register outputs a low potential; and the clock signal CLKE_4 is a low level, such that the second clock signal output by the second clock terminal CLKD of the fourth level of shift register is a low potential signal, and the first output terminal OUT<4> of the fourth level of shift register output a low potential.

In a second stage T2 of the display mode, the clock signal CLKE_4 is a high level, such that the first clock signal output by the first clock terminal CLKE of the fourth level of shift register is a high potential signal; the clock signal CLKD_4 is a high level, such that the second clock signal output by the second clock terminal CLKD of the fourth level of shift register is a high potential signal, at this moment, the potential of the pull-up node Q<4> of the fourth level of shift register is self-boosted under the effect of the second capacitor C2, the third transistor M3 and the fourth transistor M4 are started completely, the cascade output terminal CR<4> of the fourth level of shift register outputs a high potential, and the first output terminal OUT<4> of the fourth level of shift register outputs a high potential. At this moment, the third control signal output by the third control terminal CLKA is still a low level signal, the second transistor M2 remains off, the second control signal output by the second control terminal OE turns into a low level signal, the first transistor M1 is turned off, the output signal output by the reset control terminal TRST is a low level signal, and the twelfth transistor M12 is turned off.

In a third stage T3 of the display mode, the clock signal CLKE_4 turns into a low level, such that the first clock signal output by the first clock terminal CLKE of the fourth level of shift register turns into a low potential signal; the clock signal CLKD_4 turns into a low level, such that the second clock signal output by the second clock terminal CLKD of the fourth level of shift register turns into a low potential signal, the cascade output terminal CR<4> of the fourth level of shift register outputs a low potential, and the first output terminal OUT<4> of the fourth level of shift register outputs a low potential. In this way, the cascade output terminal CR<4> and the first output terminal OUT<4> of the fourth level of shift register are reset.

In a fourth stage T4 of the display mode, the cascade output terminal CR<7> of the seventh level of shift register outputs a high potential, such that the discharge control signal output by the discharge control terminal G2 of the fourth level of shift register turns into a high level signal. In the fourth level of shift register, the high level signal output by the discharge control terminal G2 enables the sixth transistor M6 to be turned on, the pull-up node Q<4> is discharged by the second power terminal VGL1, the potential of the pull-up node Q<4> is pulled down, and thus, the pull-up node Q<4> is reset.

It should be noted that, in the display mode, the hold node H<4> of the fourth level of shift register is held at a high potential up to a Blank period. Wherein, it should also be noted that the sensing mode is enabled in the Blank period.

In a first stage T11 of the sensing mode, the third control signal output by the third control terminal CLKA of the fourth level of shift register is a high level signal, and the second transistor M2 is turned on. In addition, it should be noted that because the signal output by the cascade output terminal CR<2> and the second control signal OE of the second level of shift register are both high level signals and the hold node H<4> of the fourth level of shift register stores a high level in the display mode of a first frame, the high potential stored in the hold node H<4> of the fourth level of shift register is written into the pull-up node Q<4> by means of the second transistor M2 and is held by the second capacitor C2.

In a second stage T22 of the sensing mode, the third control signal output by the third control terminal CLKA of the fourth level of shift register is a low level signal, the second transistor M2 is turned off, the first clock signal output by the first clock terminal CLKE is a low potential signal, at this moment, the pull-up node Q<4> is held at a high potential, the fourth transistor M4 is turned on, and thus, the first output terminal OUT<4> outputs a low potential.

In a third stage T33 of the sensing mode, the first clock signal output by the first clock terminal CLKE of the fourth level of shift register turns into a high potential signal, such that the first output terminal OUT<4> outputs a high potential, and the second capacitor C2 is self-boosted to further increase the potential of the pull-up node Q<4>.

In a fourth stage T44 of the sensing mode, the first clock signal output by the first clock terminal CLKE of the fourth level of shift register turns into a low potential signal, such that the first output terminal OUT<4> outputs a low potential.

In a fifth stage of the sensing mode, the output signal of the reset control terminal TRST of the fourth level of shift register is a high level signal, the twelfth transistor M12 is turned on, the pull-up node Q<4> is pulled down to the potential of the second power terminal VGL1 (a low potential), and the second control signal output by the second control terminal OE is a high level signal, such that the first transistor M1 is turned on, and the low potential of the pull-up node Q<4> is written into the hold node H<4> by means of the first transistor M1 to reset the hold node H<4>.

In this way, hybrid pulses for display and compensation can be output, and any row of pixels can be compensated in the display mode of any frame.

Specifically, in the fifth stage of the sensing mode, the second control signal output by the second control terminal OE and the output signal of the reset control terminal TRST are both high level signals, such that the first transistor M1 and the twelfth transistor M12 are turned on to reset the hold nodes H and the pull-up nodes Q in all rows, and thus, any row of pixels can be compensated in the display mode.

To sum up, according to the shift register provided by the embodiments of the invention, the display control circuit is connected to the pull-up node, the first power terminal and the first control terminal, and is used to write the potential, provided by the first power terminal, into the pull-up node in the display mode under the control of the first control terminal, the sensing control circuit is connected to the pull-up node, the second control terminal and the third control terminal, and is used to control the potential of the hold node according to the second control signal of the second control terminal when the display control circuit writes the potential, provided by the first power terminal, into the pull-up node and write the potential stored in the hold node into the pull-up node in the sensing mode under the control of the third control terminal, and the first output circuit is connected to the pull-up node, the first clock terminal and the first output terminal, and is used to control the first output terminal to output a gate drive signal or a sensing drive signal in the display mode or the sensing mode according to the potential of the pull-up node and the first clock signal of the first clock terminal. In this way, the shift register provided by the embodiments of the invention is able to output hybrid pulses for display and compensation and compensate for any row of pixels in the display mode of any frame, and has a simple circuit structure.

Based on the gate drive circuit in the above embodiment, the embodiments of the invention further provide a display panel.

Figure 6:
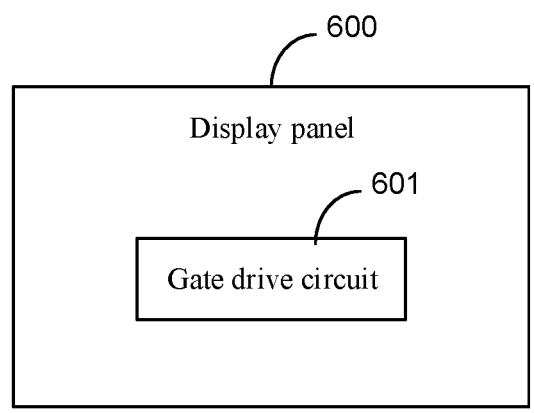
FIG. 6 is a schematic diagram of a display panel according to one embodiment of the invention.

FIG. 6 is a schematic diagram of a display panel according to the embodiments of the invention. As shown in FIG. 6, the display panel 600 comprises a gate drive circuit 601, wherein the gate drive circuit 601 may be implemented by the gate drive circuit in any one embodiment mentioned above. In some embodiments, the display panel 600 may comprise multiple levels of gate drive circuits 601.

The display panel provided by the embodiments of the invention is able to output hybrid pulses for display and compensation by means of the gate drive circuit, is able to compensate for any row of pixels in the display mode of any frame, and has a simple circuit structure.

Based on the shift register in the above embodiment, the embodiments of the invention further provide a drive method of a shift register.

FIG. 7 is a flow diagram of the drive method of a shift register according to the embodiments of the invention. As shown in FIG. 7, the drive method of a shift register provided by the embodiments of the invention comprises the following steps:

S1: in a display mode, a display control circuit writes a potential, provided by a first power terminal, into a pull-up node under the control of a first control terminal, a sensing control circuit stores the potential of the pull-up node under the control of a second control terminal, and a first output circuit supplies, a first clock signal of a first clock terminal, to a first output terminal to be used as a gate drive signal under the control of the potential of the pull-up node.

S2: in a sensing mode, the sensing control circuit writes the stored potential into the pull-up node under the control of a third control terminal, and the first output circuit supplies the first clock signal of the first clock terminal to the first output terminal to be used as a sensing drive signal under the control of the potential of the pull-up node.

It should be noted that the explanation of the embodiment of the shift register is also suitable for the drive method of a shift register, and will no longer be detailed here.

To sum up, according to the drive method of a shift register provided by the embodiments of the invention, in the display mode, the display control circuit writes the potential, provided by the first power terminal, into the pull-up node under the control of the first control terminal, the sensing control circuit stores the potential of the pull-up node under the control of the second control terminal, and the first output circuit controls the first output terminal to output the gate drive signal according to the potential of the pull-up node and the first clock signal of the first clock terminal; and in the sensing mode, the sensing control circuit writes the potential stored in a hold node into the pull-up node under the control of the third control terminal, and the first output circuit controls the first output terminal to output the sensing drive signal according to the potential of the pull-up node and the first clock signal of the first clock terminal. Thus, the drive method of a shift register provided by the embodiments of the invention is able to output hybrid pulses for display and compensation and compensate for any row of pixels in the display mode of any frame, and the circuit structure is simple.

"One embodiment", "some embodiments", "example", "specific example", or "some examples" in this specification means that specific features, structures, materials, or characteristics described in conjunction with said embodiment or example are included in at least one embodiment or example of the disclosure. The illustrative expression of these terms in this specification does not definitely refer to the same embodiment or example. In addition, the specific features, structures, materials or characteristics may be combined in any one or more embodiments or examples in any appropriate manners. Moreover, those skilled in the art may integrate and combine different embodiments or examples described in the specification and the features of different embodiments or examples without any mutual contradictions.

In addition, the terms "first" and "second" are merely for the purpose of description, and should not be construed as indicating or implying relative importance or implicitly indicating the number of technical features referred to. Thus, a feature defined by "first" or "second" may explicitly or implicitly refer to the inclusion of one or more said feature. Unless otherwise specified, "multiple" in the description of the disclosure refers to at least two, such as two or three.

Any process or method described by the flow diagram or in other manners may be construed as one or more modules, segments, or parts including codes of executable instructions for implementing customized logic functions or steps of the process. In addition those skilled in the art would appreciate that the preferred embodiments of the invention may be implemented in other ways, and may be implemented not in the order illustrated or discussed, and the functions involved may be performed basically synchronously or in a reverse order.

The logics and/or steps shown in the flow diagram or described in other ways in the specification may be construed as, for example, a fixed-sequence list of executable instructions for realizing logic functions, and may be specifically implemented in any computer-readable media to be used by an instruction execution system, device or facility (such as computer-based system, a system comprising a processor, or other systems capable of acquiring instructions from the instruction execution system, facility or device to execute the instructions), or be used in conjunction with the instruction execution system, device or facility. In this specification, the "computer-readable media" may be any devices including, storing, communicating, propagating or transmitting programs and used by or in conjunction with the instruction execution system, device, or facility. More specifically, examples of the computer-readable media (a non-exhaustive list) include: an electrical connection part (electronic device) provided with one or more wirings, a portable computer cartridge disk (disk device), a random access memory (RAM), a read-only memory (ROM), an electrically programmable read-only memory (EPROM or flash memory), an optical fiber device, and a portable CD read-only memory (CDROM). In addition, the computer-readable media may even be paper printed with the program or other suitable media because the paper or other media can be optically scanned to electrically obtain the program by edition, interpretation, or processing in other appropriate manners when necessary, and then the program is stored in a computer memory.

It should be understood that all parts of the invention may be implemented by hardware, software, firmware, or combinations thereof. In the above embodiments, multiple steps or methods may be stored in a memory and implemented by executing corresponding software or firmware by an appropriate instruction execution system. For example, if implemented by hardware like in other embodiments, the parts may be implemented by any one or the combination of the following techniques commonly known in the art: a discrete logic circuit provided with a logic gate circuit for realizing the logic function of data signals, an application-specific integrated circuit with an appropriate combinational logic gate circuit, a programmable gate array (PGA), a field programmable gate array (FPGA), and the like.

Those ordinarily skilled in the art would appreciate that all or part of the steps of the method in the above embodiments may be implemented by relevant hardware instructed by a program that may be stored in a computer-readable storage medium, and when the program is executed, one or the combination of the steps of the method in the above embodiments will be implemented.

The storage medium mentioned above may be a read-only memory, a magnetic disk, a CD, or the like. Although the embodiments of the invention have been illustrated and described above, it should be understood that the above embodiments are merely illustrative ones, and should not be construed as limitations of the invention. Those ordinarily skilled in the art can make variations, amendments, substitutions and transformations to the above embodiments within the scope of the invention.

The invention claimed is:

1. A shift register, wherein the shift register comprises:
a display control circuit connected to a pull-up node, a first power terminal and a first control terminal, and configured to write a potential, provided by the first power terminal, into the pull-up node in a display mode under the control of the first control terminal;
a sensing control circuit connected to the pull-up node, a second control terminal and a third control terminal, and configured to store the potential of the pull-up node in the display mode under the control of the second control terminal and write the stored potential into the pull-up node in a sensing mode under the control of the third control terminal; and
a first output circuit connected to the pull-up node, a first clock terminal and a first output terminal, and configured to supply a first clock signal of the first clock terminal to the first output terminal under the control of the potential of the pull-up node;
wherein the sensing control circuit comprises:
a sensing input sub-circuit connected to the pull-up node, a hold node, and the second control terminal, and configured to store the potential of the pull-up node in the hold node under the control of the second control terminal; and
a sensing pull-up sub-circuit connected to the pull-up node, the hold node and the third control terminal, and configured to write the potential, stored in the hold node, into the pull-up node in the sensing mode under the control of the third control terminal;
wherein the sensing input sub-circuit comprises:
a first transistor having a first pole connected to the pull-up node, a second pole connected to the hold node, and a control pole connected to the second control terminal; and
a first capacitor having a terminal directly connected to the hold node and a terminal directly connected to a second power terminal.

2. The shift register according to claim 1, wherein the sensing pull-up sub-circuit comprises:
a second transistor having a first pole connected to the hold node, a second pole connected to the pull-up node, and a control pole connected to the third control terminal.

3. The shift register according to claim 1, wherein the first output circuit comprises:
a third transistor having a first pole connected to the first clock terminal, a second pole connected to the first output terminal, and a control pole connected to the pull-up node; and
a second capacitor having a terminal connected to the control pole of the third transistor and a terminal connected to the second pole of the third transistor.

4. The shift register according to claim 1, wherein the shift register further comprises:
a cascade output circuit connected to a second clock terminal, the pull-up node and a cascade output terminal, and configured to supply a second clock signal of the second clock terminal to the cascade output terminal under the control of the potential of the pull-up node.

5. The shift register according to claim 4, wherein the cascade output circuit comprises:
a fourth transistor having a first pole connected to the second clock terminal, a second pole connected to the cascade output terminal, and a control pole connected to the pull-up node.

6. The shift register according to claim 4, wherein the display control circuit comprises:
an input sub-circuit connected to the pull-up node, the first power terminal and the first control terminal, and configured to write the potential, provided by the first power terminal, into the pull-up node in the display mode under the control of the first control terminal;
a discharge sub-circuit connected to the pull-up node, a second power terminal and a discharge control terminal, and configured to discharge the pull-up node to a potential of the second power terminal according to a discharge control signal of the discharge control terminal;
a pull-down control sub-circuit connected to the pull-up node, a pull-down node, the first power terminal and the second power terminal, and configured to control a potential of the pull-down node by means of the potential of the first power terminal and the potential of the second power terminal under the control of the pull-up node;

a first pull-down sub-circuit connected to the pull-down node, the pull-up node, the cascade output terminal and the second power terminal, and configured to pull the pull-up node and the cascade output terminal down to the potential of the second power terminal under the control of the pull-down node;

a second pull-down sub-circuit connected to the pull-down node, the first output terminal and a third power terminal, and configured to pull the first output terminal down to a potential of the third power terminal under the control of the pull-down node; and a reset sub-circuit connected to a reset control terminal, the pull-up node and the second power terminal, and configured to reset the pull-up node to the potential of the second power terminal under the control of the reset control terminal.

7. The shift register according to claim 6, wherein the input sub-circuit comprises: a fifth transistor having a first pole connected to the first power terminal, a second pole connected to the pull-up node, and a control pole connected to the first control terminal.

8. The shift register according to claim 6, wherein the discharge sub-circuit comprises: a sixth transistor having a first pole connected to the pull-up node, a second pole connected to the second power terminal, and a control pole connected to the discharge control terminal.

9. The shift register according to claim 6, wherein the pull-down control sub-circuit comprises: a seventh transistor and an eighth transistor, wherein a control pole and a first pole of the seventh transistor are both connected to the first power terminal, a second pole of the seventh transistor and a first pole of the eighth transistor are connected to the pull-down node, a control pole of the eighth transistor is connected to the pull-up node, and a second pole of the eighth transistor is connected to the second power terminal.

10. The shift register according to claim 6, wherein the first pull-down sub-circuit comprises: a ninth transistor and a tenth transistor, wherein a first pole of the ninth transistor is connected to the pull-up node, a second pole of the ninth transistor is connected to the second power terminal, a control pole of the ninth transistor is connected to the pull-down node, a first pole of the tenth transistor is connected to the cascade output terminal, a second pole of the tenth transistor is connected to the second power terminal, and a control pole of the tenth transistor is connected to the pull-down node.

11. The shift register according to claim 6, wherein the second pull-down sub-circuit comprises: an eleventh transistor having a first pole connected to the first output terminal, a second pole connected to the third power terminal, and a control pole connected to the pull-down node.

12. The shift register according to claim 6, wherein the reset sub-circuit comprises: a twelfth transistor having a first pole connected to the pull-up node, a second pole connected to the second power terminal, and a control pole connected to the reset control terminal.

13. A gate drive circuit, wherein the gate drive circuit comprises N levels of cascaded shift registers according to claim 1, wherein N is an integer greater than 1.

14. The gate drive circuit according to claim 13, wherein the first control terminal of an nth level of shift register is connected to a cascade output terminal of a (n−2)th level of shift register, and a discharge control terminal of the nth level of shift register is connected to a cascade output terminal of a (n+3)th level of shift register, wherein n is an integer, and $3 \leq n \leq N-3$.

15. A display panel, wherein the display panel comprises the gate drive circuit according to claim 13.

16. A drive method of the shift register according to claim 1, wherein the method comprises:

in the display mode, writing, by the display control circuit under the control of the first control terminal, the potential provided by the first power terminal into the pull-up node, storing, by the sensing control circuit under the control of the second control terminal, the potential of the pull-up node, and supplying, by the first output circuit under the control of the potential of the pull-up node, the first clock signal of the first clock terminal to the first output terminal; and in the sensing mode, writing, by the sensing control circuit under the control of the third control terminal, the stored potential into the pull-up node, and supplying, by the first output circuit under the control of the potential of the pull-up node, the first clock signal of the first clock terminal to the first output terminal.

17. The gate drive circuit according to claim 13, wherein the sensing control circuit comprises:

a sensing input sub-circuit connected to the pull-up node, a hold node, and the second control terminal, and configured to store the potential of the pull-up node in the hold node under the control of the second control terminal; and a sensing pull-up sub-circuit connected to the pull-up node, the hold node and the third control terminal, and configured to write the potential, stored in the hold node, into the pull-up node in the sensing mode under the control of the third control terminal.

18. The gate drive circuit according to claim 17, wherein the sensing input sub-circuit comprises:

a first transistor having a first pole connected to the pull-up node, a second pole connected to the hold node, and a control pole connected to the second control terminal; and a first capacitor having a terminal connected to the hold node and a terminal connected to a second power terminal.

\* \* \* \* \*